(12) United States Patent
Balakrishnan et al.

(10) Patent No.: US 10,644,007 B2
(45) Date of Patent: *May 5, 2020

(54) DECOUPLING CAPACITOR ON STRAIN RELAXATION BUFFER LAYER

(71) Applicant: INTERNATIONAL BUSINESS MACHINES CORPORATION, Armonk, NY (US)

(72) Inventors: Karthik Balakrishnan, White Plains, NY (US); Kangguo Cheng, Schenectady, NY (US); Pouya Hashemi, White Plains, NY (US); Alexander Reznicek, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/053,356

(22) Filed: Aug. 2, 2018

(65) Prior Publication Data

US 2018/0350816 A1    Dec. 6, 2018

Related U.S. Application Data

(60) Continuation of application No. 15/298,733, filed on Oct. 20, 2016, now Pat. No. 10,090,307, which is a
(Continued)

(51) Int. Cl.
    *H01L 27/108*    (2006.01)
    *H01L 27/06*    (2006.01)
    (Continued)

(52) U.S. Cl.
    CPC ...... *H01L 27/1087* (2013.01); *H01L 21/0245* (2013.01); *H01L 21/02507* (2013.01);
    (Continued)

(58) Field of Classification Search
    None
    See application file for complete search history.

(56) References Cited

U.S. PATENT DOCUMENTS 4,987,102 A  *  1/1991  Nguyen ............ H01L 21/02129
                                                        118/50.1
5,155,657 A  *  10/1992  Oehrlein ............ H01L 21/3065
                                                        257/298
(Continued)

OTHER PUBLICATIONS

Hollander, B. et al., "Wet Chemical Etching of Si, Si1-xGex, and Ge in HF: H2O2:Ch3COOH" Journal of the Electrochemical Society (Apr. 2010) pp. H643-H646, vol. 157, No. 6.

(Continued)

*Primary Examiner* — Vincent Wall
(74) *Attorney, Agent, or Firm* — Tutunjian & Bitetto, P.C.; Vazken Alexanian

(57) ABSTRACT

An electrical device including a substrate structure including a relaxed region of alternating layers of at least a first semiconductor material and a second semiconductor material. A first region of the substrate structure includes a first type conductivity semiconductor device having a first strain over a first portion of the relaxed region. A second region of the substrate structure includes a second type conductivity semiconductor device having a second strain over a second portion of the relaxed region. A third region of the substrate structure including a trench capacitor extending into relaxed region, wherein a width of the trench capacitor defined by the end to end distance of the node dielectric for the trench capacitor alternates between at least two width dimensions as a function of depth measured from the upper surface of the substrate structure.

20 Claims, 7 Drawing Sheets

Related U.S. Application Data division of application No. 15/003,196, filed on Jan. 21, 2016, now Pat. No. 10,424,585.

(51) Int. Cl.

| | | |
|---|---|---|
| *H01L 49/02* | (2006.01) | |
| *H01L 29/10* | (2006.01) | |
| *H01L 29/94* | (2006.01) | |
| *H01L 21/8234* | (2006.01) | |
| *H01L 21/8238* | (2006.01) | |
| *H01L 27/088* | (2006.01) | |
| *H01L 27/12* | (2006.01) | |
| *H01L 21/02* | (2006.01) | |
| *H01L 27/092* | (2006.01) | |
| *H01L 29/08* | (2006.01) | |
| *H01L 29/165* | (2006.01) | |
| *H01L 29/78* | (2006.01) | |
| *H01L 29/16* | (2006.01) | |

(52) U.S. Cl.
CPC .......... *H01L 21/02532* (2013.01); *H01L 21/823431* (2013.01); *H01L 21/823814* (2013.01); *H01L 21/823821* (2013.01); *H01L 27/0629* (2013.01); *H01L 27/0886* (2013.01); *H01L 27/092* (2013.01); *H01L 27/1211* (2013.01); *H01L 28/40* (2013.01); *H01L 28/60* (2013.01); *H01L 28/86* (2013.01); *H01L 28/90* (2013.01); *H01L 28/92* (2013.01); *H01L 29/0847* (2013.01); *H01L 29/1054* (2013.01); *H01L 29/16* (2013.01); *H01L 29/165* (2013.01); *H01L 29/7848* (2013.01); *H01L 29/945* (2013.01); *H01L 21/0262* (2013.01); *H01L 21/823807* (2013.01)

(56) References Cited

U.S. PATENT DOCUMENTS

| | | | | |
|---|---|---|---|---|
| 5,160,987 A | * | 11/1992 | Pricer | H01L 21/30608 |
| | | | | 257/303 |
| 5,380,674 A | * | 1/1995 | Kimura | H01L 27/10829 |
| | | | | 257/E27.092 |
| 5,532,182 A | * | 7/1996 | Woo | H01L 27/10817 |
| | | | | 257/E21.016 |
| 5,843,822 A | | 12/1998 | Hsia et al. | |
| 6,027,968 A | | 2/2000 | Nguyen et al. | |
| 6,624,018 B1 | | 9/2003 | Yu et al. | |
| 7,060,632 B2 | | 6/2006 | Fitzgerald et al. | |
| 7,224,015 B1 | | 5/2007 | Skotnicki et al. | |
| 7,705,345 B2 | | 4/2010 | Bedell et al. | |
| 9,123,566 B2 | | 9/2015 | Mitard et al. | |
| 9,570,575 B1 | | 2/2017 | Balakrishnan et al. | |
| 2003/0030091 A1 | * | 2/2003 | Bulsara | H01L 27/1087 |
| | | | | 257/301 |
| 2004/0146644 A1 | * | 7/2004 | Xiao | C07F 7/10 |
| | | | | 427/255.28 |
| 2004/0232461 A1 | * | 11/2004 | Huang | H01L 27/10861 |
| | | | | 257/296 |
| 2007/0001203 A1 | * | 1/2007 | Lehr | H01L 27/0629 |
| | | | | 257/296 |
| 2012/0049262 A1 | * | 3/2012 | Huang | H01L 27/1087 |
| | | | | 257/304 |
| 2014/0008730 A1 | | 1/2014 | Mitard et al. | |
| 2014/0361378 A1 | * | 12/2014 | Lee | H01L 27/0928 |
| | | | | 257/369 |
| 2015/0079803 A1 | * | 3/2015 | Huang | H01L 21/02373 |
| | | | | 438/758 |
| 2015/0162337 A1 | * | 6/2015 | Cheng | H01L 27/10826 |
| | | | | 257/532 |

OTHER PUBLICATIONS

U.S. Office Action issued in related U.S. Appl. No. 15/298,733, dated Aug. 10, 2017, pp. 1-34.

U.S. Notice of Allowance issued in U.S. Appl. No. 15/298,733, dated May 23, 2018, pp. 1-15.

List of IBM Patents or Patent Applications Treated as Related dated Aug. 2, 2018, 2 pages.

* cited by examiner ically used for fabricating field effect transistors (FETs) as part of advanced integrated circuits (IC), such as CPUs, memory, storage devices, and the like.

DECOUPLING CAPACITOR ON STRAIN RELAXATION BUFFER LAYER

BACKGROUND

Technical Field

The present disclosure relates to microelectronic devices, such as semiconductor devices composed of strained semiconductor materials and capacitors.

Description of the Related Art

Complementary Metal-oxide-semiconductor (CMOS) technology is commonly used for fabricating field effect transistors (FETs) as part of advanced integrated circuits (IC), such as CPUs, memory, storage devices, and the like. At the core of FETs, a channel region is formed in an n-doped or p-doped semiconductor substrate on which a gate structure is formed. Depending whether the on-state current is carried by electrons or holes, the FET comes as an n-FET device or a p-FET device. The overall fabrication process may include forming a gate structure over a channel region connecting source-drain regions within the substrate on opposite sides of the gate, typically with some vertical overlap between the gate and the source-drain region. The dimensions of semiconductor field effect transistors (FETs) have been steadily shrinking over the last thirty years or so, as scaling to smaller dimensions leads to continuing device performance improvements. On-chip decoupling capacitor (DECAP) is desired in some applications. On-chip capacitors consume a significant chip area. With increasing device scaling, new capacitor arrangements are being examined.

SUMMARY

In one aspect, an electrical device is provided that includes a substrate structure including a relaxed region of alternating layers of at least a first semiconductor material and a second semiconductor material. A first region of the substrate structure includes a first type conductivity semiconductor device having a first strain over a first portion of the relaxed region. A second region of the substrate structure includes a second type conductivity semiconductor device having a second strain over a second portion of the relaxed region. A third region of the substrate structure including a trench capacitor extending into relaxed region, wherein a width of the trench capacitor defined by the end to end distance of the node dielectric for the trench capacitor alternates between at least two width dimensions as a function of depth measured from the upper surface of the substrate structure.

In another embodiment, the electrical device includes a substrate structure including a relaxed region of alternating layers of at least a first silicon including material and a first silicon and germanium including material. The electrical device includes a first region of the substrate structure including an n-type conductivity semiconductor device on a tensile strain surface of a second silicon including material present a first portion of the relaxed region composed of the first silicon and germanium including material. The electrical device also includes a second region of the substrate structure including a p-type conductivity semiconductor device on a compressive strain surface of a second silicon and germanium including material over a second portion of the relaxed region composed of the first silicon and germanium including material. The second silicon and germanium including material has a greater germanium content than the first silicon and germanium including material. The third region of the substrate structure includes a trench capacitor extending into the relaxed region, wherein a width of the trench capacitor defined by the end to end distance of the node dielectric for the trench capacitor alternates between at least two width dimensions as a function of depth measured from the upper surface of the substrate structure.

In another aspect, a method of forming an electronic device is provided that includes providing a substrate structure including a relaxed region of alternating layers of at least a first semiconductor material and a second semiconductor material. A tensile strained semiconductor material layer is formed on a first portion of the relaxed region. A compressive strained semiconductor material layer is formed on a second portion of the relaxed region. An n-type semiconductor device on the tensile strained semiconductor material layer, and a p-type semiconductor device on the compressive strained semiconductor material layer. The method may further include forming a trench capacitor in a third portion of the relaxed region. A width of the trench capacitor may be defined by the end to end distance of the node dielectric for the trench capacitor, which alternates between at least two width dimensions as a function of depth measured from the upper surface of the substrate structure.

BRIEF DESCRIPTION OF DRAWINGS

The following detailed description, given by way of example and not intended to limit the disclosure solely thereto, will best be appreciated in conjunction with the accompanying drawings, wherein like reference numerals denote like elements and parts, in which.

DETAILED DESCRIPTION OF THE PREFERRED EMBODIMENTS

Figure 1:
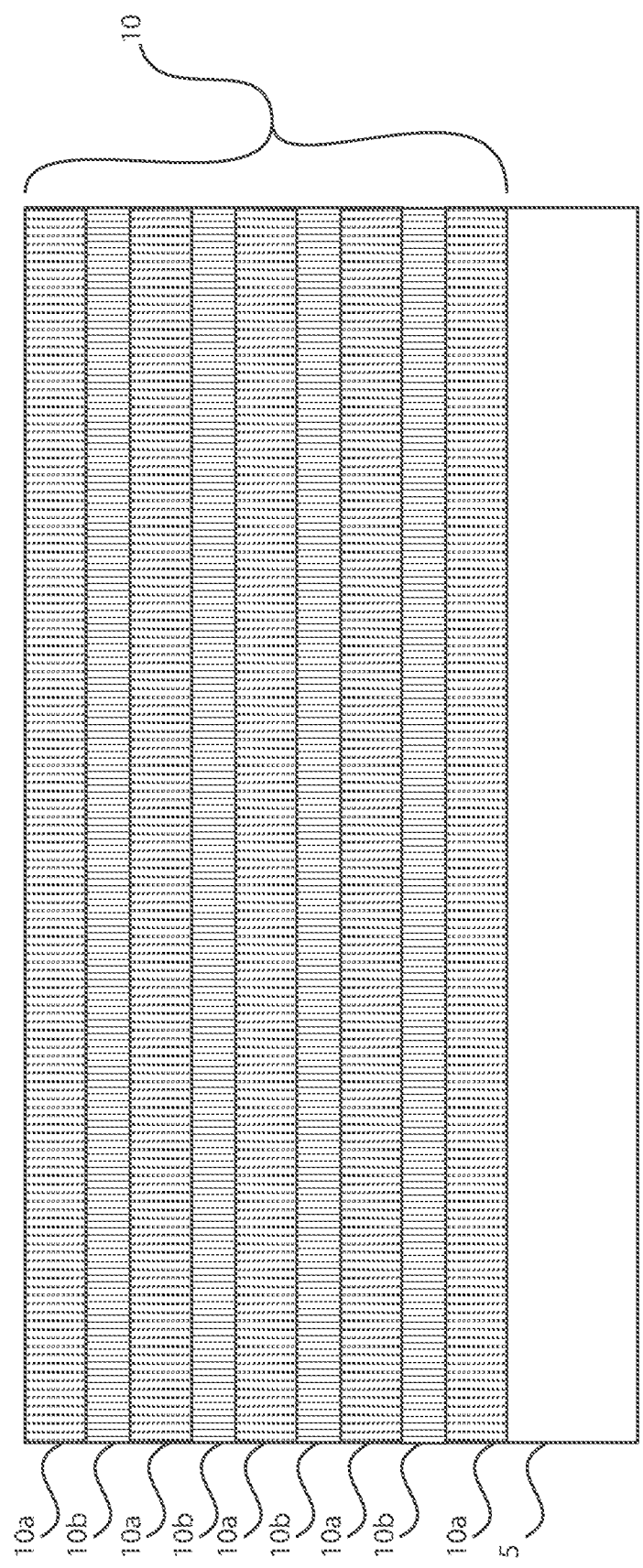
FIG. 1 is a side cross-sectional view depicting one embodiment of a substrate structure including a relaxed region of alternating layers of at least a first semiconductor material and a second semiconductor material, in accordance with the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "present on", and "over" mean that a first element, such as a first structure, is present on a second element, such as a second structure, wherein intervening elements, such as an interface structure, e.g. interface layer, may be present between the first element and the second element. The terms "direct contact" and "contacting" mean that a first element, such as a first structure, and a second element, such as a second structure, are connected without any intermediary conducting, insulating or semiconductor layers at the interface of the two elements. As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor. A field effect transistor (FET) is a semiconductor device in which output current, i.e., source-drain current, is controlled by the voltage applied to a gate structure to the semiconductor device. A field effect transistor has three terminals, i.e., gate structure, source region and drain region.

In some embodiments, the methods and structures disclosed herein provide field effect transistor (FET) semiconductor device having strained based performance enhancements. One way to strain the channel region of the FinFET is by growing strain inducing epitaxial material, in which the epitaxial material being grown has different lattice dimensions than the deposition surface that the epitaxial material is formed on. For example, germanium (Ge) that is epitaxially grown on a silicon germanium (SiGe) deposition surface produces a compressive stress that when induced on the channel region of a p-type conductivity FinFET increases hole carrier mobility, and silicon (Si) that is epitaxially grown on a silicon germanium (SiGe) deposition surface produces a tensile stress that when induced on the channel region of an n-type conductivity FinFET increases electron carrier mobility. The term "epitaxial material" denotes a semiconductor material that has been formed using an epitaxial growth and/or epitaxial deposition process. "Epitaxial growth and/or epitaxial deposition" means the growth of a semiconductor material on a deposition surface of a semiconductor material, in which the semiconductor material being grown has substantially the same crystalline characteristics as the semiconductor material of the deposition surface. In some embodiments, when the chemical reactants are controlled, and the system parameters set correctly, the depositing atoms of an epitaxial deposition process arrive at the deposition surface with sufficient energy to move around on the surface and orient themselves to the crystal arrangement of the atoms of the deposition surface. An epitaxial material has substantially the same crystalline characteristics as the semiconductor material of the deposition surface. For example, an epitaxial film deposited on a {100} crystal surface will take on a {100} orientation. The epitaxial deposition process may be carried out in the deposition chamber of a chemical vapor deposition (CVD) apparatus.

Uniaxial compressively strained germanium (Ge) and silicon germanium (SiGe) for p-type field effect transistors, and uniaxial tensile strained silicon (Si) for n-type field effect transistors, are silicon friendly and reasonable channel materials to start with to increase performance and carrier speed in field effect transistor (FET) semiconductor devices. The methods and structures disclosed herein provide tensile strained silicon (Si) including channel regions for n-type semiconductor devices adjacent to strained germanium (Ge) including channel regions for p-type semiconductor devices both overlying a relaxed region, e.g., at least partially relaxed region, of a substrate structure.

The methods and structures disclosed herein also provide a capacitor, such as a decoupling capacitor that is vertically orientated using a trench type arrangement, wherein the trench housing the capacitor extends into the relaxed region of the substrate structure. A "capacitor" is a structure including two electrically conductive materials separated and insulated from each other by a dielectric for storing a charge. The electrically conductive materials may be referred to as electrodes. The term "electrode" as used to describe a component of the capacitor represents one of the two electrically conductive materials of the capacitor that are separated by the dielectric layer. "Doped portion" as used to describe the outer electrode of the capacitor means that the portion of the semiconductor substrate about the trench which has been doped to be electrically conductive. A "node dielectric layer" is the dielectric layer that is present between the electrodes of the capacitor.

The methods and structures disclosed herein provide for forming decoupling capacitors with high capacitance density on a strain relaxation buffer (SRB) substrate. Strained transistors, e.g., strained field effect transistors (FETs), are also formed on the SRB substrate to boost device performance. In one example, a high density capacitance is achieved by forming a super lattice (Si/SiGe/Si/SiGe . . . ) strain relaxation buffer (SRB) substrate, and then etching one semiconductor material, e.g., SiGe, of the SRB substrate selectively to another semiconductor material, e.g., Si, of the SRB substrate to form a three dimensional structure with varying widths, e.g., a three dimensional trench structure with varying widths. The decoupling capacitor is formed in the three dimensional trench structure having the varying width. The methods and structures of the present disclosure are now discussed with more detail referring to FIGS. 1-7.

FIG. 1 depicts one embodiment of forming a strain relaxed buffer (SRB) region 10, i.e., an at least partially relaxed stack of semiconductor materials, on a substrate 5. As used herein, the term "partially relaxed" as used to describe a semiconductor material means a material that is epitaxially formed on a deposition surface, wherein the lattice constant of the semiconductor material that is epitaxially formed is not the same as the lattice dimension of the deposition surface. In some embodiments, the material layers of the strain relaxed buffer (SRB) region 10 is composed of at least partially relaxed material, which have a composition that is selected to be as relaxed as possible. In some embodiments, the composition and processing of the at least partially relaxed semiconductor materials in the strain relaxed buffer (SRB) region 10 is set to a target of at least 90% relaxation, in either direction. In some embodiments, the material layers in the strain relaxed buffer (SRB) region 10 is set to a target ranging from 98% to 100% relaxation.

In some embodiments, the strain relaxed buffer (SRB) region 10 includes a first layer of a first semiconductor material 10a, e.g., silicon and germanium including material layer, and a second layer of a second semiconductor material 10b, e.g., silicon including material layer, that are in an alternating arrangement. Typically, each material layer 10a, 10b has a thickness ranging from 10 nm to 40 nm. In some embodiments, the thickness of each material layer 10a, 10b in the strain relaxed buffer (SRB) region 10 ranges from 15 nm to 35 nm. In one example, each material layer 10a, 10b has a thickness of 30 nm. The total thickness for the entirety of first and second layer of the first and second semiconductor material 10a, 10b that provide the strain relaxed buffer (SRB) region 10 may range from 1 μm to 5 μm. The thickness of the upper most material layer for the strain relaxed buffer (SRB) region 10, e.g., first layer of the first semiconductor material (silicon and germanium including material, e.g., SiGe), may be thicker to facilitate the formation of the semiconductor devices in the complementary metal oxide semiconductor (CMOS) arrangement.

In some embodiments, the first layer of the first semiconductor material layer 10a has a composition with a lattice dimension that is greater than the second layer of the second semiconductor material layer 10b. The first layer of the first semiconductor material 10a is typically a silicon (Si) and germanium (Ge) including material layer. In some embodiments, the silicon and germanium including material that provides the first layer of the first semiconductor material 10a may be provided by silicon germanium (SiGe). For example, the silicon and germanium including material that provides the first semiconductor material layer 10a of the stress relaxed buffer (SRB) region 10 may be silicon germanium (SiGe) with a germanium concentration ranging from 15 wt. % to 35 wt. %. In another example, the silicon and germanium including material that provides the first semiconductor material layer 10a is composed of silicon germanium (SiGe) having a germanium (Ge) concentration of 25 wt. %. The silicon and germanium including material that provides the first semiconductor material 10a may further include elements that when mixed with silicon produces a lattice dimension that is greater than a material layer of pure silicon.

The second layer of the second semiconductor material 10b is typically a silicon including material layer. In some embodiments, the silicon including material that provides the second layer of the second semiconductor material 10b may include, but is not limited to silicon, single crystal silicon, strained silicon, silicon doped with carbon (Si:C), silicon alloys or any combination thereof. For example, the silicon including material that provides the second semiconductor material 10b may include greater than 95 wt %. silicon (Si). In another example, the second semiconductor material may include greater than 99 wt. % silicon (Si), e.g., 100 wt. % silicon (Si). The silicon including material that provides the second semiconductor material 10b may further include elements that when mixed with silicon produces a lattice dimension that is less than a material layer of pure silicon, e.g., a combination of silicon and carbon. Elements producing a lattice dimension greater than pure silicon (Si), e.g., germanium (Ge), are not included in the base composition (the base material does not include n-type or p-type dopants) of the second semiconductor material 10b.

The substrate 5 that the strain relaxed buffer (SRB) region 10 is formed on may be a semiconductor substrate. The semiconductor substrate may have a single crystal, i.e., monocrystalline, crystal structure. In some embodiments, the semiconductor substrate 5 is composed of a silicon including material. In some embodiments, the silicon including material that provides the semiconductor substrate may include, but is not limited to silicon, single crystal silicon, strained silicon, silicon doped with carbon (Si:C), silicon alloys or any combination thereof. Although, the semiconductor substrate that is depicted in FIG. 1 is a bulk semiconductor substrate, the present disclosure is not limited to only this embodiment. For example, the semiconductor substrate may also be a semiconductor on insulator (SOI) substrate. In some examples, when the semiconductor substrate is an SOI substrate, the SOI substrate may include a base semiconductor substrate, a buried insulating layer that is present on the base semiconductor substrate, and a semiconductor on insulator (SOI) layer that is present on the buried insulator layer. In some embodiments, the SOI layer may be composed of a silicon including material that is similar to the above description of the silicon material for the bulk semiconductor substrate. The buried insulating layer may be an oxide, such as silicon oxide. The base semiconductor substrate may be a semiconducting material that may include, but is not limited to, silicon (Si), germanium (Ge), silicon germanium (SiGe), silicon germanium doped with carbon (SiGe:C), germanium alloys, GaAs, InAs, InP as well as other III/V and II/VI compound semiconductors.

In another embodiment, the strain relaxed buffer (SRB) region 10 that is formed on the substrate 5 may be formed using by epitaxial deposition for each of the first semiconductor material 10a and the second semiconductor material 10b, in which the first and second semiconductor materials 10a, 10b area formed in an alternating sequence to provide the strain relaxed buffer (SRB) region 10 that is depicted in FIG. 1. The first semiconductor materials 10a may be epitaxially formed and composed of silicon germanium, wherein the silicon sources for epitaxial deposition may be selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof, and the germanium gas sources may be selected from the group consisting of germane, digermane, halogermane, dichlorogermane, trichlorogermane, tetrachlorogermane and combinations thereof. The second semiconductor materials 10b may be epitaxially formed and composed of silicon, wherein the silicon sources for epitaxial deposition may be selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof.

It is noted that the strain relaxed buffer (SRB) region 10 that is depicted in FIG. 1 includes five first layers of first semiconductor material 10a and four second layers of second semiconductor material 10b, the present disclosure is not limited to only this example, as the SRB region 10 may be composed of any number of semiconductor material layers. For example, the SRB region 10 may be composed any number of semiconductor material layers 10a, 10b ranging from 5 layers to 30 layers. In other examples, the SRB region 10 may be composed of 5 layers to 15 layers of semiconductor material.

Figure 2:
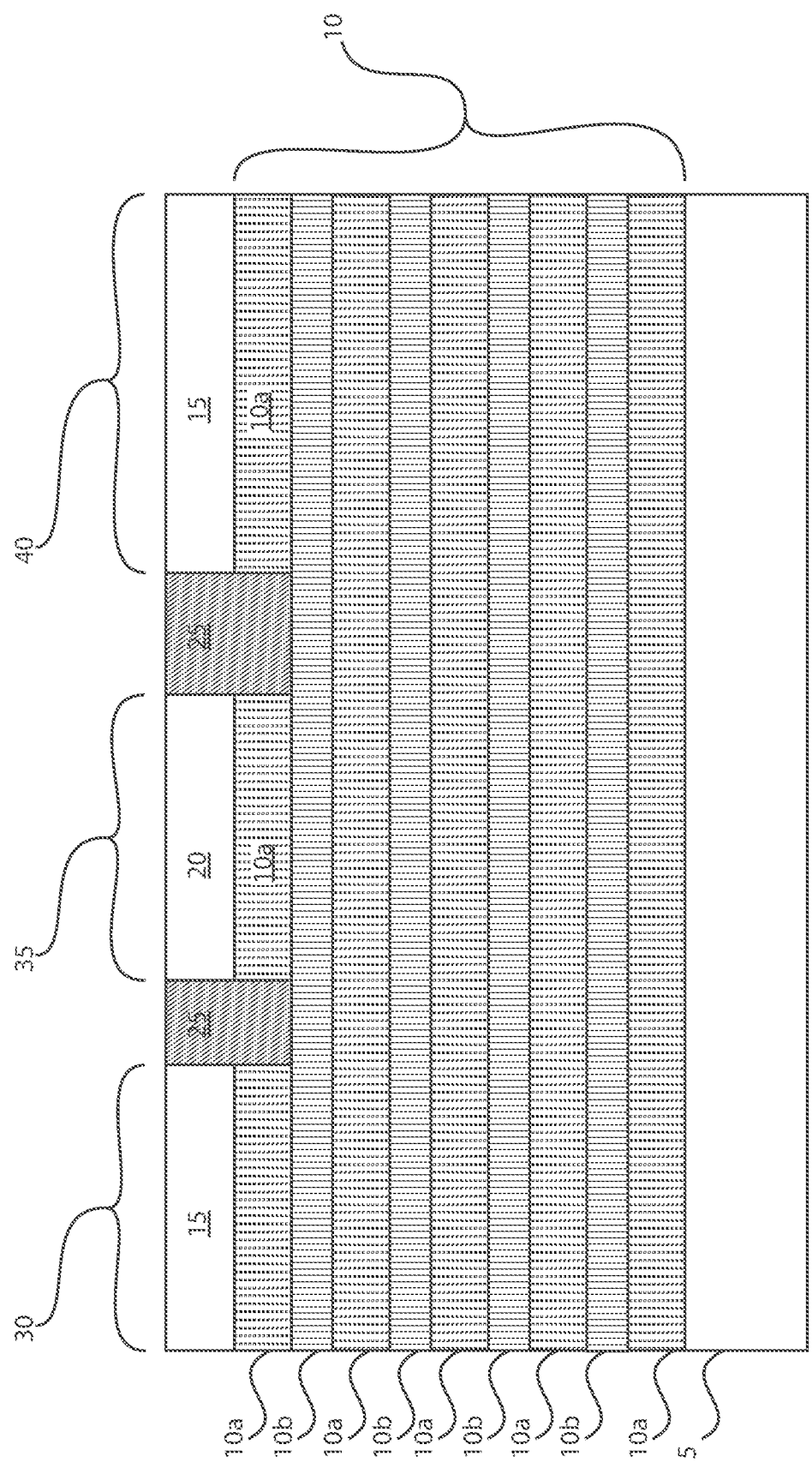
FIG. 2 is a side cross-sectional view depicting one embodiment of forming a tensile strained semiconductor material layer on a first portion of the relaxed region, and a compressive strained semiconductor material layer on a second portion of the relaxed region, in accordance with the present disclosure.

FIG. 2 depicts one embodiment of forming a tensile strained semiconductor material layer 15 on a first portion of the relaxed region, i.e., strain relaxed buffer (SRB) region 10, and a compressive strained semiconductor material layer 20 on a second portion of the relaxed region, i.e., strain relaxed buffer (SRB) region 10. The term "strained" means the presence of a strain, either compressive or tensile, which is developed during preparation of a structure, and can therefore be retained in the structure without external force, in contrast to an extrinsic stress that is applied to a structure by an external force and can only be maintained by maintaining the external force. For example, when a semiconductor material, such as silicon germanium (SiGe), has a larger natural lattice dimension than the deposition surface on which it is formed, such as silicon (Si), and the material is epitaxially formed so that it is formed with the lattice dimension of the deposition surface, which is less than the material's natural lattice dimension, than the material being epitaxially formed will have an intrinsic strain, i.e., intrinsic compressive strain. In another example, when a semiconductor material, such as silicon (Si), has a smaller natural lattice dimension, than the deposition surface on which it is formed, such as silicon germanium (SiGe), and the material is epitaxially formed so that it is formed with the lattice dimension of the deposition surface, which is more than the material's natural lattice dimension, than the material being formed will have an intrinsic strain, i.e., an intrinsic tensile strain.

Referring to FIG. 2, in some embodiments, the upper surface of the strain relaxed buffer (SRB) region 10 is composed of a first layer of a first semiconductor material 10a composed of silicon germanium (SiGe) having a germanium (Ge) content of 25 wt. % or less. The tensile strained semiconductor material layer 15 is composed of a semiconductor material composition having a lattice constant that is less than the lattice constant of the upper surface of the strain relaxed bugger (SRB) region 10. In the embodiment that is depicted in FIG. 2, the tensile strained semiconductor material layer 15 is composed of silicon (Si) when the upper surface of the strain relaxed buffer (SRB) region 10 is composed of silicon germanium (SiGe). The compressive strained semiconductor material layer 20 is composed of a semiconductor material composition having a lattice constant that is greater than the lattice constant of the upper surface of the strain relaxed bugger (SRB) region 10. In one example, when the upper surface of the strain relaxed buffer (SRB) region 10 is composed of a first layer of a first semiconductor material 10a composed of silicon germanium (SiGe) having a germanium (Ge) content of 25 wt. % or less, the compressive strained semiconductor material layer 20 is composed of epitaxially formed silicon germanium (SiGe) having a germanium (Ge) content greater than 25 wt. %, e.g., having a germanium (Ge) content of 50 wt. % or greater. The tensile strained semiconductor material 15 and the compressive strained semiconductor material 20 are formed using an epitaxial growth process. In some embodiments, the gas sources described above for forming the silicon and germanium containing semiconductor materials for the strain relaxation buffer (SRB) region 10 are suitable for forming the tensile and compressive strained semiconductor material layers 15, 20.

The tensile strained semiconductor material layer 15 is formed over a first region 30 and a third region 40 of the strain relaxed buffer (SRB) region 10, and the compressive strained semiconductor material layer 20 is formed over a second region 35 of the strain relaxed buffer (SRB) region 10. It is noted that block masks, e.g., photoresist block masks (not shown), may be used to selectively form the tensile strained semiconductor material layers 15 overlying the first region 30 and the third region 40 of the strain relaxed buffer (SRB) region 10, and the compressively strained semiconductor material layer 20 overlying the second region 35 of the strain relaxed buffer (SRB) region 10. For example, a first block mask can formed atop the first region 30 and the third region 40 leaving the second region 35 exposed. The second region 35 is then processed to provide the compressive strained semiconductor material layer 20. The first block mask can then be removed, and a second block mask may be formed over the second region 35 including the compressive strained semiconductor material layer 20. The second block mask is not formed over the first region 30 and the third region 40 of the strain relaxed buffer (SRB) region 10. Thereafter, the tensile strained semiconductor material layer 15 can be formed on the exposed surface of the strain relaxed buffer (SRB) region 10. After forming the tensile strained semiconductor material layer 15, the second block mask may be removed.

FIG. 2 also depicts one embodiment of forming a plurality isolation regions 25 separating the tensile strained semiconductor material layer 15 in the first region 30 from the compressive strained semiconductor material 20 in the second region 35, and separating the compressive strained semiconductor material 20 in the second region 35 from the tensile strained semiconductor material layer 15 in the third region 40. The isolation regions 25 may be formed using photolithography, etching and deposition processes. More specifically, an etch mask composed of a photoresist may be patterned to expose the regions, in which the isolation regions 25 are to be formed. Trenches can be in accordance with the openings in the etch mask using an anisotropic etch process. An "anisotropic etch process" denotes a material removal process in which the etch rate in the direction normal to the surface to be etched is greater than in the direction parallel to the surface to be etched. One form of anisotropic etching that is suitable for forming the fin trenches 15 is reactive ion etching. The trenches may then be filled with a dielectric material to form the isolation regions 25. The dielectric may be an oxide, e.g., silicon oxide, or nitride, e.g., silicon nitride, that is deposited using a chemical vapor deposition (CVD) process, such as plasma enhanced chemical vapor deposition (PECVD).

Figure 3:
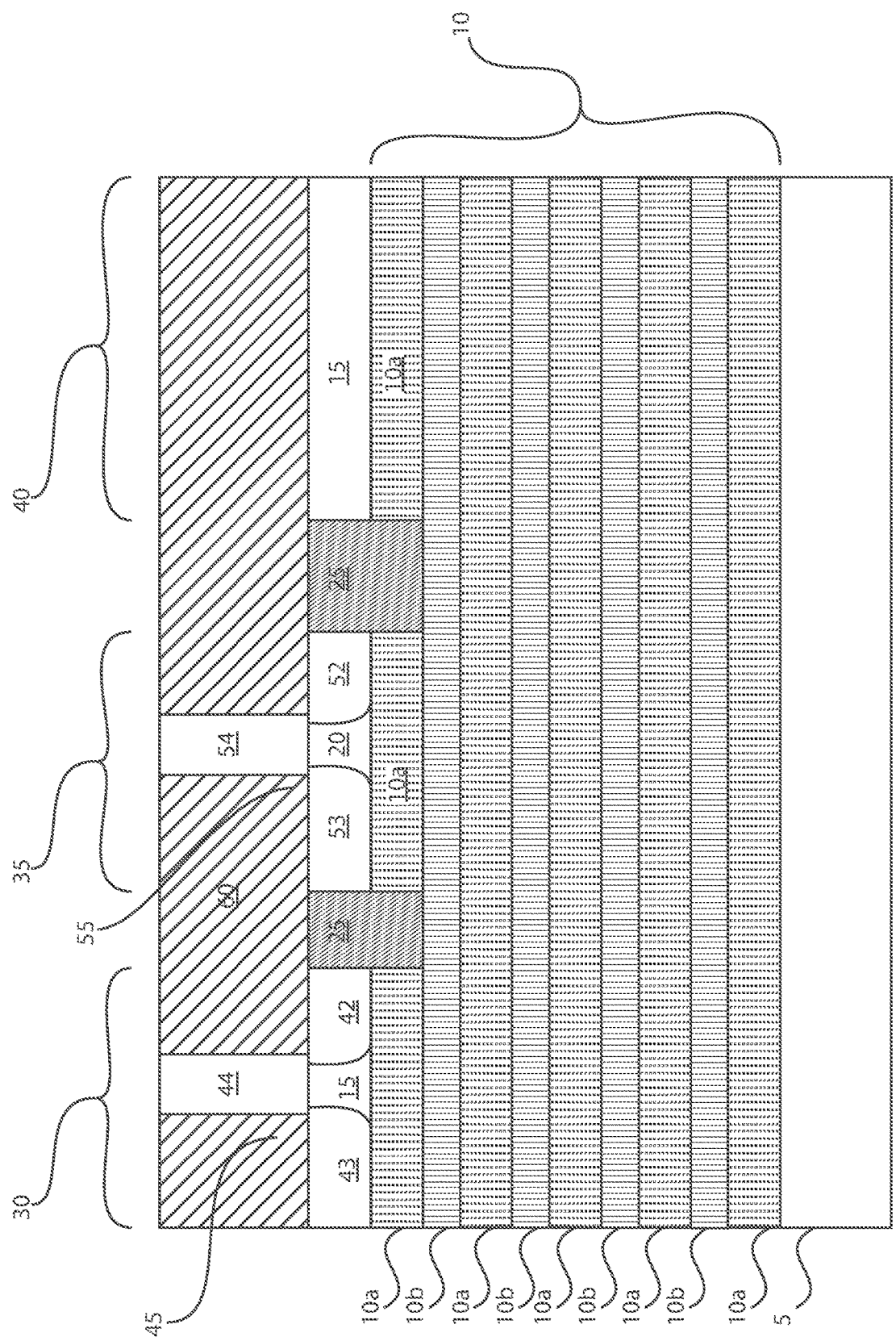
FIG. 3 is a side cross-sectional view depicting forming an n-type semiconductor device on the tensile strained semiconductor material layer, and a p-type semiconductor device on the compressive strained semiconductor material layer, in accordance with one embodiment of the present disclosure.

FIG. 3 depicts forming an n-type semiconductor device 45, e.g., n-type field effect transistors (nFET) on the tensile strained semiconductor material layer 15, and a p-type semiconductor device 55, e.g., p-type field effect transistors (pFET), on the compressive strained semiconductor material layer 20. In some embodiments, each n-type semiconductor device 45 and the p-type semiconductor device 55 includes a gate structure 44, 54 that is formed on the upper surface of the tensile and the compressive strained semiconductor material layers 15, 20, and a source region 43, 53 and a drain region 42, 52 that are formed within the tensile and the compressive strained semiconductor material layer 15, 20, on opposing sides of the gate structures 44, 54. The "gate structure" functions to switch the semiconductor device from an "on" to "off" state, and vice versa. As used herein, the term "drain region" means a doped region in semiconductor device located at the end of the channel, in which carriers are flowing out of the transistor through the drain. As used herein, the term "source region" is a doped region in the semiconductor device, in which majority carriers are flowing into the channel.

The gate structures 44, 54 typically include at least one gate dielectric layer and at least one gate conductor layer. In one embodiment, the at least one gate dielectric layer employed in the present disclosure includes, but is not limited to, an oxide, nitride, oxynitride and/or silicates including metal silicates, aluminates, titanates and nitrides. In one example, when the at least one gate dielectric layer is comprised of an oxide, the oxide may be selected from the group including, but not limited to, $SiO_2$, $HfO_2$, $ZrO_2$, $Al_2O_3$, $TiO_2$, $La_2O_3$, $SrTiO_3$, $LaAlO_3$, $Y_2O_3$ and mixture thereof. The physical thickness of the at least one gate dielectric layer may vary, but typically, the at least one gate dielectric layer has a thickness from 1 nm to 10 nm. In one embodiment, the at least one gate dielectric layer has a thickness from 1 nm to 3 nm. In one embodiment, the at least one gate dielectric layer for the gate structures 44, 54 may be deposited by chemical vapor deposition (CVD). Variations of CVD processes suitable for depositing the gate dielectric layers include, but are not limited to, plasma enhanced chemical vapor deposition (PECVD), metal organic chemical vapor deposition (MOCVD), atomic layer deposition (ALD), and combinations thereof.

The conductive material that provides the at least one gate conductor may comprise polysilicon, SiGe, a silicide, a metal or a metal-silicon-nitride such as Ta—Si—N. Examples of metals that can be used as the conductive material for the at least one gate conductor include, but are not limited to, Al, W, Cu, and Ti or other like conductive metals. The conductive materials for the at least one gate conductor may be formed by a deposition process, such as CVD, plasma-assisted CVD, plating, and/or sputtering.

Following deposition of the materials layers for the at least one gate dielectric and the at least one gate conductor, the gate structures 44, 54 may be defined using photolithography and etch processes. In one example, a pattern is produced by applying a photoresist to the surface to be etched, exposing the photoresist to a pattern of radiation, and then developing the pattern into the photoresist utilizing a resist developer. Once the patterning of the photoresist is completed, the sections of the stack of the at least one gate dielectric layer and the at least one gate conductor layer covered by the photoresist are protected to provide the gate structures 44, 54, while the exposed regions are removed using a selective etching process that removes the unprotected regions. Following formation of the gate structures, the photoresist may be removed.

The source regions 43, 53 and the drain regions 42, 52 is formed on opposing sides of the gate structures 44, 54. Typically, the conductivity type of the source and drain regions 35, 40 dictates the conductivity type of the device. For example, the source and drain regions 43, 42 of the n-type semiconductor device 45 are doped to an n-type conductivity, and the source and drain regions 53, 52 of the p-type semiconductor device 55 are doped to a p-type conductivity. As used herein, "p-type" refers to the addition of impurities to an intrinsic semiconductor that creates deficiencies of valence electrons. The p-type conductivity semiconductor devices are typically produced within silicon containing materials by doping the source and drain regions with elements from group III-A of the Periodic Table of Elements. In a silicon-containing fin structure, examples of p-type dopants, i.e., impurities, include but are not limited to boron, aluminum, gallium and indium. As used herein, "n-type" refers to the addition of impurities that contributes free electrons to an intrinsic semiconductor. N-type conductivity semiconductor devices are typically produced within silicon containing material by doping the source and drain regions with elements from group V-A of the Periodic Table of Elements. In a silicon containing fin structure, examples of n-type dopants, i.e., impurities, include but are not limited to, antimony, arsenic and phosphorous. The source and drain regions 42, 43, 52, 53 may be formed after the gate structures 44, 54 using ion implantation. In other embodiments, raised source and drain regions of in situ doped epitaxially formed semiconductor material may also be present.

The above description of forming the n-type semiconductor device 45 and the p-type semiconductor device 55 is for a gate first process. In another embodiment, the process sequence for forming the n-type semiconductor device 45 and the p-type semiconductor device 55 includes a gate last process sequence, which is not depicted in the supplied figures. A gate last process includes forming a replacement gate structure on the channel portion of the semiconductor devices, forming a spacer on the sidewall of the replacement gate structure, forming source and drain regions on opposing sides of the replacement gate structure, removing the replacement gate structure, and forming a functional gate structure in the space once occupied by the replacement gate structure. The replacement gate structure can include sacrificial material that defines the geometry of a later formed functional gate structure that functions to switch the semiconductor device from an "on" to "off" state, and vice versa. A process sequence employing a replacement gate structure may be referred to as a "gate last" process sequence. Both gate first and gate last process sequences are applicable to the present disclosure.

It is also noted, that although the figures and above description describe planar semiconductor devices, i.e., planar field effect transistors (FETs), the present disclosure is not limited to only this embodiment. Any semiconductor device may be formed in the first region 30 and the second region 35 of the structure. For example, the planar semiconductor devices may be substituted with fin type field effect transistors (FinFETs).

FIG. 3 further depicts forming an interlevel dielectric layer 60. The interlevel dielectric layer 60 may be selected from the group consisting of silicon containing materials such as $SiO_2$, $Si_3N_4$, $SiOXN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H). Additional choices for the interlevel dielectric layer 60 include any of the aforementioned materials in porous form, or in a form that changes during processing to or from being porous and/or permeable to being non-porous and/or non-permeable. The interlevel dielectric layer 60 may be deposited using chemical vapor deposition or spin on deposition.

Figure 4:
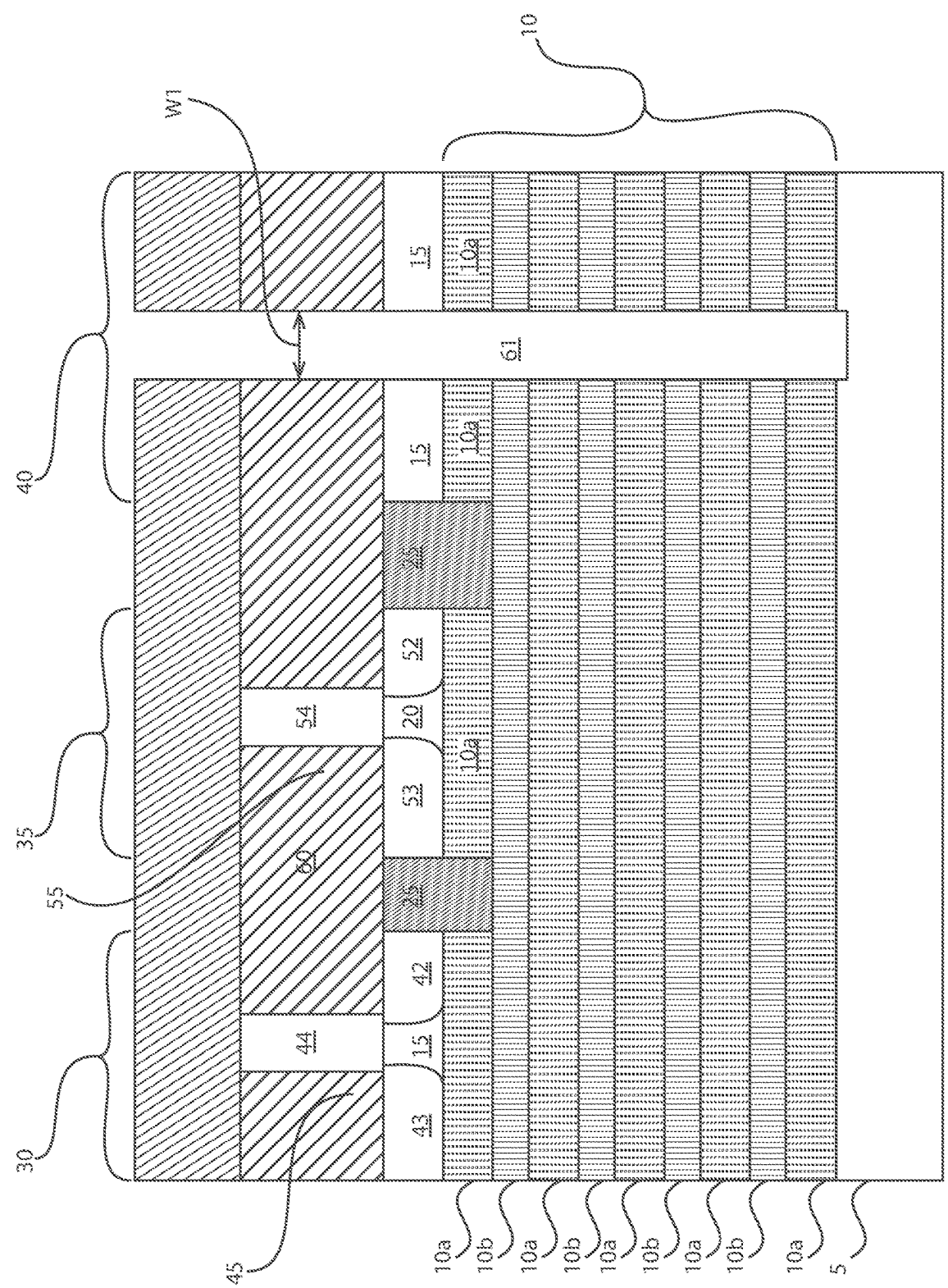
FIG. 4 is a side cross-sectional view depicting etching a trench into a portion of the relaxed region that is separate from the portions underlying the n-type and p-type semiconductor devices, in accordance with one embodiment of the present disclosure.

FIG. 4 depicts etching a trench 61 into a portion of the relaxed region, e.g., strain relaxed buffer (SRB) region 10, which is separate from the portions underlying the n-type and p-type semiconductor devices 45, 55. For example, the trench 61 may be formed in a third region 40. The trench 61 may be etched into the relaxed region, e.g., strain relaxed buffer (SRB) region 10, by forming an etch mask 62 overlying the interlevel dielectric layer 60 having an opening present there through in the third region 40 overlying the portion of the relaxed region, e.g., strain relaxed buffer (SRB) region 10, in which the trench 61 is to be formed. The etch mask 62 may be composed of a photoresist material. In one example, the etch mask 62 is produced by applying a photoresist to the surface to be etched, exposing the photoresist to a pattern of radiation, and then developing the pattern into the photoresist utilizing a resist developer. Once the patterning of the photoresist is completed, the sections of the structure depicted in FIG. 4 covered by the photoresist etch mask 62 are protected, while the exposed portions of the interlevel dielectric layer 60 and the underlying portion of the strain relaxed buffer (SRB) region 10 are removed using a selective etching process that removes the unprotected regions.

In some embodiments, following formation of the photoresist etch mask 62, the trench is formed using an anisotropic etch step, such as reactive ion etching (RIE). Reactive Ion Etching (RIE) is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present disclosure include ion beam etching, plasma etching or laser ablation.

In some embodiments, the trench 61 may be etched to extend through an entire depth of the strained relaxed buffer (SRB) region 10. In some embodiments, the trench 61 at this point of the process flow of the present disclosure has a substantially uniform width W1. In one embodiment, the width W1 of the trench 61 may range from 50 nm to 500 nm. In another embodiment, the width W1 of the trench 61 may range from 100 nm to 2000 nm. In yet another embodiment, the width W1 of the trench 61 may range from 100 nm to 300 nm.

Figure 5:
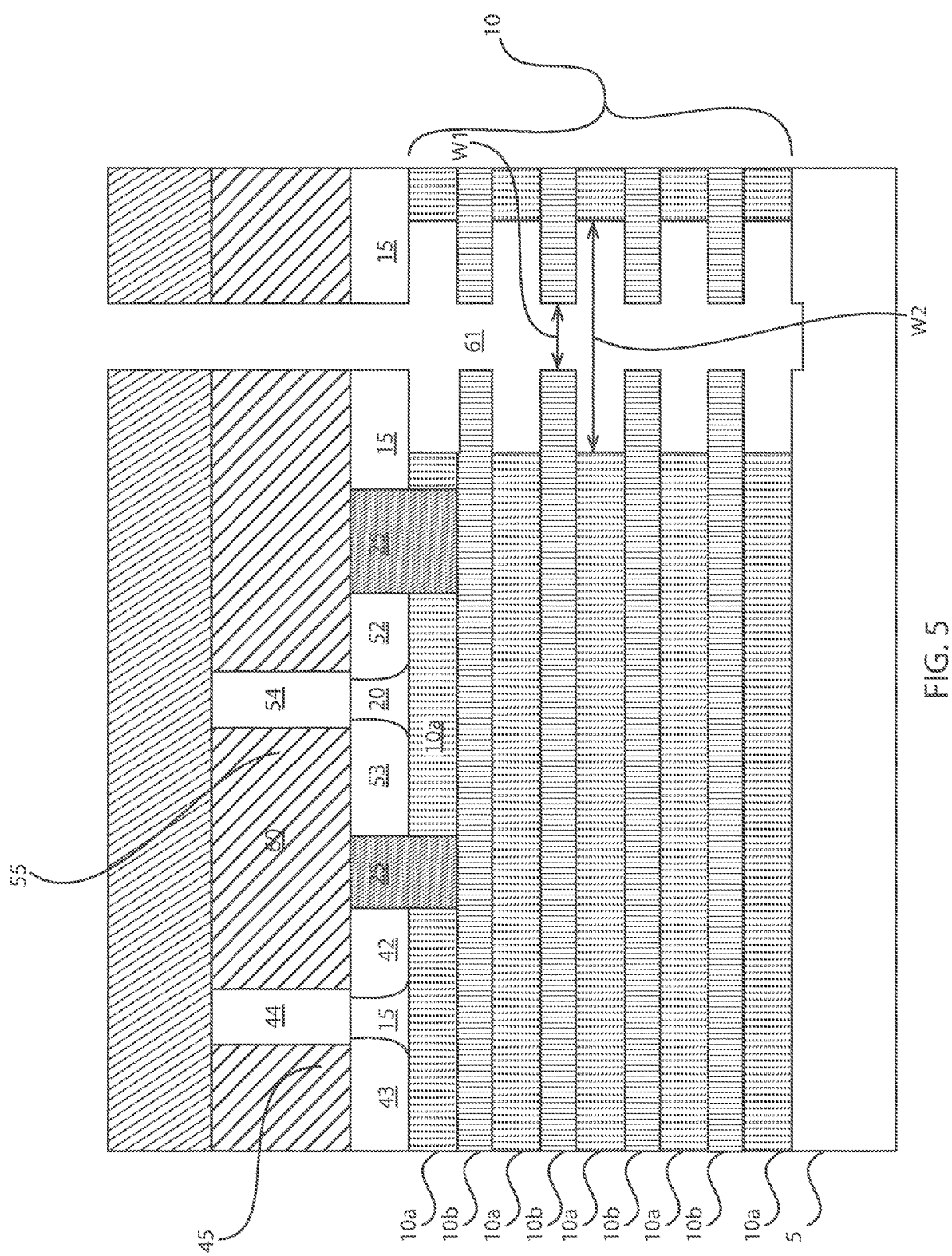
FIG. 5 is a side cross-sectional view depicting one embodiment of laterally etching one of the first semiconductor material and the second semiconductor material selectively to the other of the first semiconductor material and the second semiconductor material, in accordance with the present disclosure.

FIG. 5 depicts one embodiment of laterally etching one of the first semiconductor material 10a and the second semiconductor material 10b selectively to the other of the first semiconductor material 10a and the second semiconductor material 10b. More specifically, FIG. 5 depicts etching the first semiconductor material 10a, which in some embodiments is composed of silicon germanium (SiGe), selectively to the second semiconductor material 10b, which in some embodiments is composed of silicon (Si). The portions of the second layers of the second semiconductor material 10b that are laterally undercut by etching the first layers of the first semiconductor material 10b may be referred to as branches.

The term "selective" as used to describe a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 10:1 or greater, e.g., 100:1 or greater. The etch process for recessing the first semiconductor material 10a may be an isotropic etch. In one embodiment, the etch for laterally etching the first semiconductor material 10a may be a wet chemical etch. In one example, the lateral undercut depicted in FIG. 5 illustrates removing silicon germanium (SiGe) selectively to silicon with a chemistry composed of hydrogen chloride gas (HCl).

After the lateral etching process, the width of the trench 61 alternates between at least two width dimensions W1, W2 as a function of depth measured from the upper surface of the substrate structure, as depicted in FIG. 5. In the embodiment that is depicted in FIG. 5, the width W1 of the trench 61 in the portions of the trench 61 passing through the second layers of second semiconductor material 10b is a lesser width of the trench 61, while the width W2 of the trench in the portions of the trench 61 passing through the first layers of first semiconductor material 10a is a greater width of the trench 61.

In some embodiments, the portion of the trench 61 extending through the first layers of first semiconductor material 10a has been widened to a second width, i.e., width W2, that may be at least 25% greater than the first width, i.e., width W1, of the trench 61 passing through the second layers of second semiconductor material 10b. In another embodiment, the portion of the trench 61 extending through the first layers of first semiconductor material 10a has been widened to a width W2 that may be at least 50% greater than the width W1 of the trench 61 passing through the second layers of second semiconductor material 10b. In some embodiments, the aforementioned portion of the trench, i.e., second width W2, can be widened to be 100%-500%, or more then the first trench width W1. For example, if the first trench width is 200 nm, it can be widened 500 nm each direction. Surface area is one characteristic that can be advantageous for capacitors. In another example, the second width W2 of the trench 61 may range from 100 nm to 1000 nm. In yet another example, the second width W2 of the trench 61 may range from 200 nm to 4000 nm. In an even further example, the second width W2 of the trench 61 may range from 200 nm to 1000 nm.

The alternating width of the trench 61 between the least two width dimensions W1, W2 as a function of the trench depth increases the surface area of the trench sidewalls. This provides for increased surface area of the first electrode and node dielectric of the capacitor that is formed within the trench 61, when compared to a capacitor that is formed in a similar trench having a uniform width.

Figure 6:
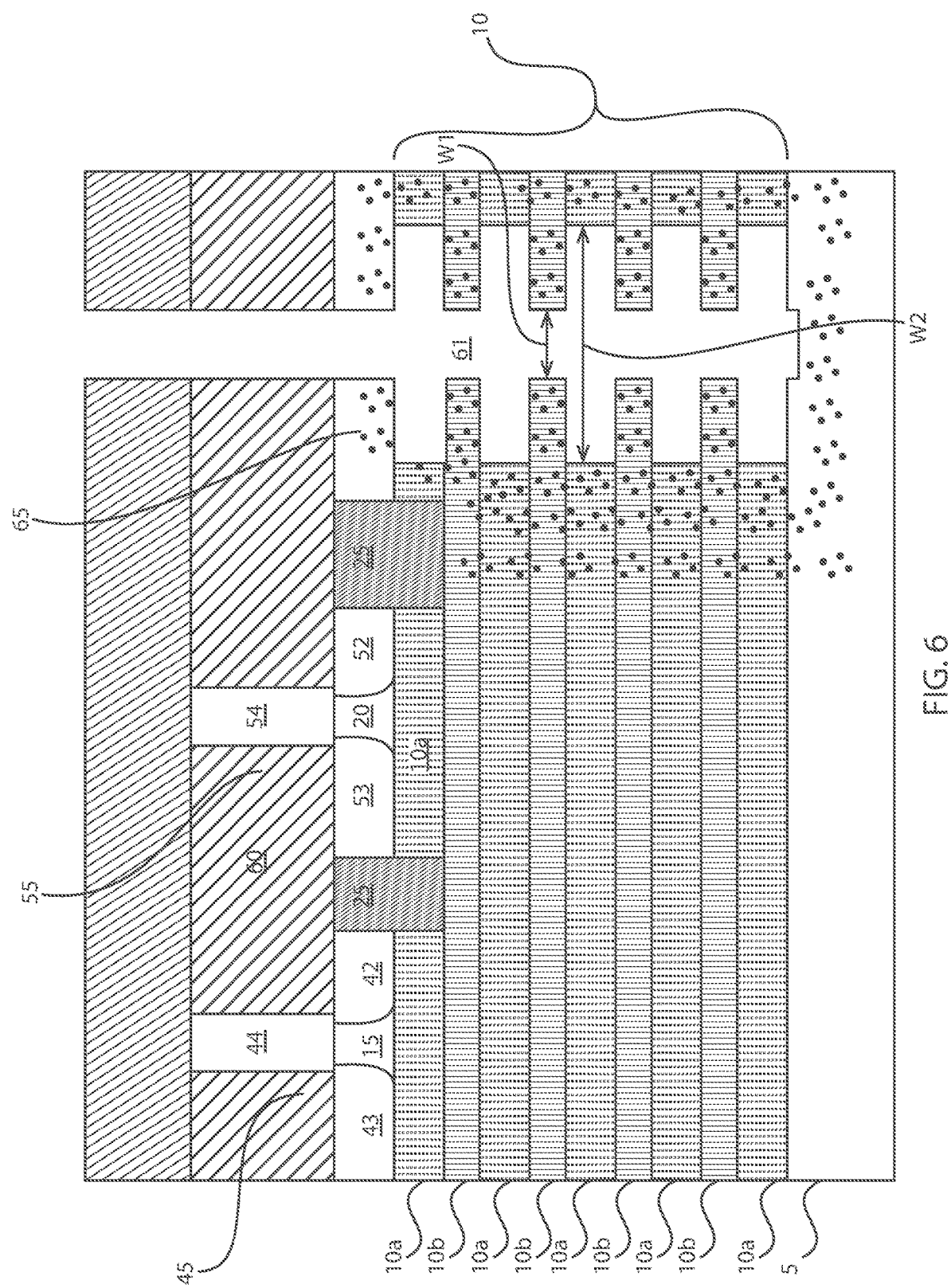
FIG. 6 is a side cross-sectional view depicting forming a first electrode on sidewalls of the first semiconductor material and the second semiconductor material that provide the trench, in accordance with one embodiment of the present disclosure.

FIG. 6 depicts forming a first electrode 65 of the capacitor being formed in the trench 61 on sidewalls of the first semiconductor material 10a and the second semiconductor material 10b that provide the trench 61. In some embodiments, the first electrode 65 is formed by gas phase doping the sidewalls of the trench 61, e.g., with an n-type dopant. The dopant that provides the first electrode 65 may have a concentration of at least $5 \times 10^{19}$ atoms/cm$^3$' preferred 2-5$\times$ $10^{20}$ atoms/cm$^3$. In one embodiment, the gas phase doping is performed at a temperature between about 850° C. to 1000° C. In one embodiment, the gas phase doping pressure is between about 1-100 Torr. The dopant is may be arsenine or phosphine gas in an inert carrier gas. In one example, when the dopant is arsenic, the dopant precursor gas can be AsH$_4$.

Figure 7:
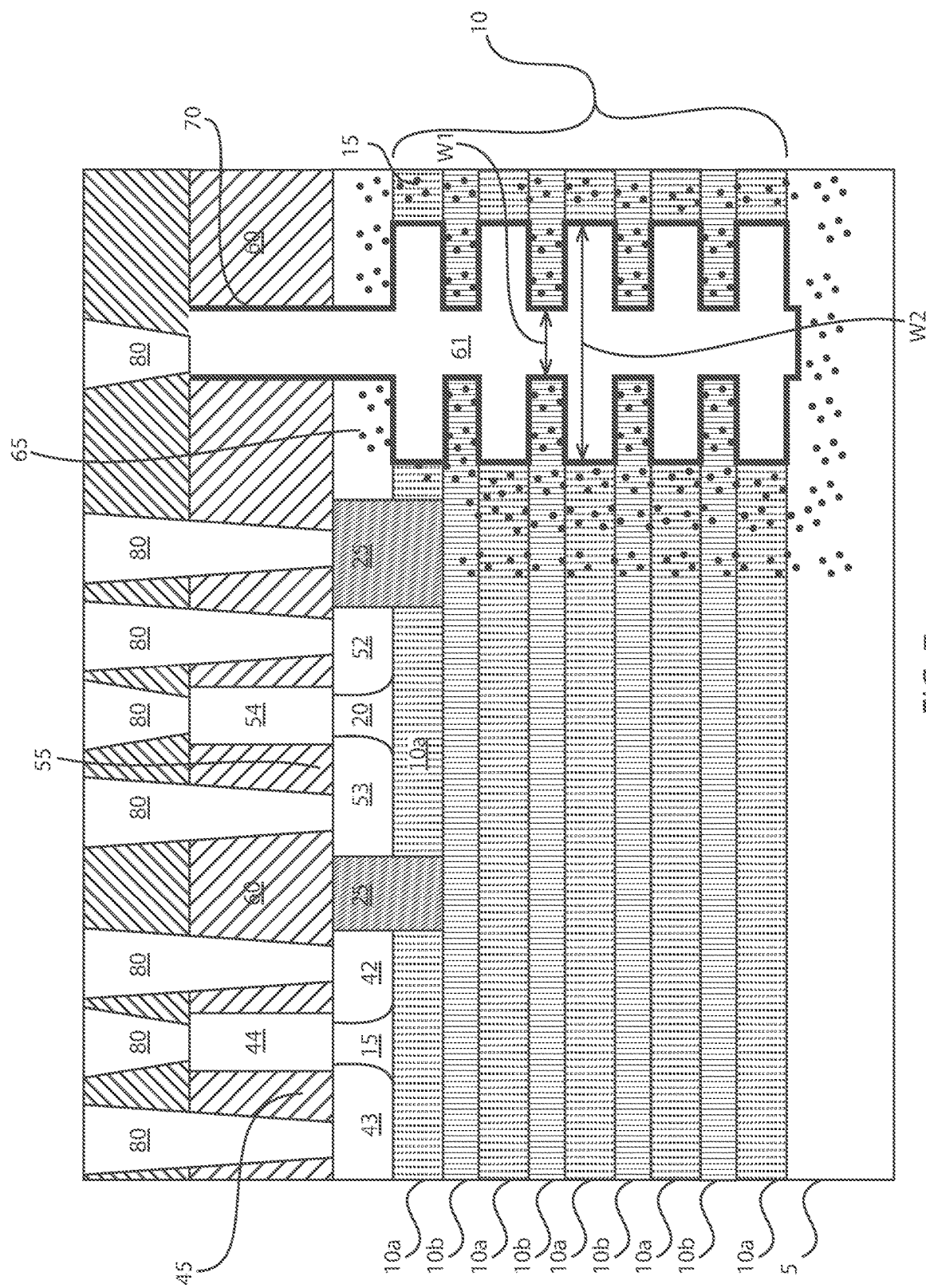
FIG. 7 is a side cross-sectional view depicting one embodiment of an electrical device including a substrate structure having a relaxed semiconductor region, wherein a first conductivity device is present on a first strained semiconductor surface overlying a first portion of the relaxed semiconductor region, a second conductivity device is present on a second strained semiconductor surface overlying a second portion of the relaxed semiconductor region, and a capacitor is present in third portion of the relaxed semiconductor region, in accordance with one embodiment of the present disclosure.

FIG. 7 depicts depositing a node dielectric layer 70 conformally on the sidewalls of the trench 61. The node dielectric layer 70 is typically a conformal layer. The term "conformal layer" denotes a layer having a thickness that does not deviate from greater than or less than 30% of an average value for the thickness of the layer. To provide the conformal layer, the node dielectric layer 70 may be deposited using atomic layer deposition (ALD). In other embodiments, the node dielectric layer 70 may be deposited using chemical vapor deposition methods, such as plasma enhanced chemical vapor deposition (PECVD). In some embodiments, the thickness of the node dielectric layer 70 may range from 0.5 nm to 20 nm. In other embodiments, the thickness of the node dielectric layer 70 may range from 1 nm to 5 nm.

The node dielectric layer 70 may be composed of any dielectric layer, such as oxides, nitride or oxynitride materials. For example, the node dielectric layer 70 may be composed of silicon oxide ($SiO_2$), or the node dielectric layer 70 may be composed of silicon nitride ($Si_3N_4$). The node dielectric layer 70 may be a high-k dielectric material. The term "high-k" denotes a material having a dielectric constant that is greater than the dielectric constant of silicon oxide ($SiO_2$). For example, the node dielectric layer 70 typically has a dielectric constant that is greater than 4.0. In another example, a high-k dielectric material that may be employed for the node dielectric layer 70 has a dielectric constant that is greater than the 10. In yet another embodiment, the high-k dielectric material for the node dielectric layer 70 is comprised of a material having a dielectric constant ranging from 10 to 30. The dielectric constants mentioned herein are relative to a vacuum at room temperature, i.e., 20° C. to 25° C. Some examples of high-k dielectric materials suitable for the node dielectric layer 70 include hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate and combinations thereof. In one example, the node dielectric layer 70 is hafnium oxide ($HfO_2$).

Still referring to FIG. 7 following the formation of the node dielectric layer 70, a second electrode 75 of the trench capacitor is formed filling the trench 61. The second electrode 75 is typically composed of a metal containing material, but conductive semiconductors may also be employed, such as n-type doped polysilicon. Some examples of metals that are suitable for the second electrode 75 include Ru, Ti, TiN, Ta, TaN, W, Al, Ag, Au, Pt or TiAlCN. In some embodiments to ensure that the trench 61 is filled without forming voids, the second electrode 75 may be deposited using atomic layer deposition (ALD). In some embodiments, in which the second electrode 75 is a metal, the second electrode 75 may be formed using physical vapor deposition (PVD) methods, such as plating, electroplating, electroless plating, sputtering and combinations thereof.

Following the formation of the decoupling trench capacitor in the trench 61, contacts 80 may be formed to the decoupling trench capacitor, the n-type semiconductor device 45 and the p-type semiconductor device 55. Forming the contacts 80 may include depositing an interlevel dielectric layer, forming openings for the capacitors through the interlevel dielectric layer using photolithography and etch processes, and depositing conductive materials for the contacts 80 within the openings. The contacts 80 to the decoupling trench capacitor include contacts with the first electrode 65 and the second electrode 75. The contacts to each of the n-type semiconductor device 45 and the p-type semiconductor device 55 may include contacts to the source and drain regions 42, 43, 52, 53 and the gate structures 44, 54. FIG. 7 depicts one embodiment of an electrical device including a substrate structure 5 including a relaxed region of alternating layers of at least a first semiconductor material 10a and a second semiconductor material 10b (which may be referred to as a strain relaxed buffer (SRB) region 10). The first semiconductor material 10a may be a silicon including layer and the second semiconductor material 10b may be a silicon and germanium including layer.

A first region 30 of the substrate structure includes a first type conductivity semiconductor device 45 having a first strain over a first portion of the relaxed region. A second region 35 of the substrate structure 5 includes a second type conductivity semiconductor device 55 having a second strain over a second portion of the relaxed region. The first region 30 may comprise a tensile strained silicon including material 15 atop an upper surface of the relaxed region. The first type conductivity semiconductor device 45 can be an n-type field effect transistor. The tensile strain typically produces increased electron carrier mobility, which provides a performance enhancement for n-type conductivity semiconductor devices. The tensile strain produced within the tensile strained silicon including material 15 may range from 200 MPa to 3 GPa. The second region 35 may comprise a compressive strained silicon and germanium including material 20 atop an upper surface of the relaxed region. The second type conductivity semiconductor device 55 can be a p-type field effect transistor. The compressive strain typically produces increased hole carrier mobility, which provides a performance enhancement for p-type conductivity semiconductor devices. The compressive strain produced within the compressive strained silicon and germanium including material 20 may range from 200 MPa to 3 GPa.

Referring to FIG. 7, the third region 40 of the substrate structure includes the trench capacitor 65, 70, 75 that extends into relaxed region. The width of the trench capacitor defined by the end to end distance of the node dielectric 70 for the trench capacitor alternates between at least two width dimensions W1, W2 as a function of depth measured from the upper surface of the substrate structure. The capacitor includes a first electrode 65 provided by doped sidewalls of the relaxed region, a node dielectric 70 formed on the doped sidewalls that provide the trench that positions the capacitor, and a second electrode 75 present on the node dielectric 70 and filling the trench. The first electrode 65 can be provided by an n-type dopant in a semiconductor material that provides the relaxed region. The node dielectric 70 can be composed of a conformal high-k dielectric material. The second electrode 75 may be composed of a metal.

The varying width of the trench provides for increase surface area, which provides for increased capacitance density for the capacitor formed within the trench when compared to capacitors formed within a trench having a uniform, i.e., non-varying width.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the methods and structures of the present disclosure have been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming an electronic device comprising:
providing a substrate structure including a strain relaxed buffer region in a relaxed region;
forming a tensile strained semiconductor material layer on a first portion of the relaxed region;
forming a compressive strained semiconductor material layer on a second portion of the relaxed region;
forming a first semiconductor device on the tensile strained semiconductor material layer and a second semiconductor device on the compressive strained semiconductor material layer; and
forming a trench capacitor in a third portion of the relaxed region at a depth within the strain relaxed buffer region, wherein a width of the trench capacitor alternates between at least two width dimensions, the trench capacitor including a node dielectric on sidewalls of a trench containing said trench capacitor, wherein the node dielectric extends vertically along a sidewall of an interlevel dielectric to provide that an upper surface of the node dielectric is coplanar with an upper surface of gate structures for said first semiconductor device and said second semiconductor device.

2. The method of claim 1, wherein the relaxed region is formed on a silicon (Si) substrate.

3. The method of claim 1, wherein the relaxed region comprises a first semiconductor material of silicon and a second semiconductor material of silicon germanium comprising 25% germanium or less.

4. The method of claim 3, wherein the first and second semiconductor material layer have a thickness of 45 nm or less.

5. The method of claim 1, wherein the tensile strained semiconductor material layer is a silicon (Si) layer that is present on the second semiconductor material.

6. The method of claim 1, wherein the compressive strained semiconductor material is a silicon and germanium containing layer that is present on the second semiconductor material layer.

7. The method of claim 6, wherein the silicon and germanium containing layer comprises greater than 25% germanium.

8. The method of claim 1, wherein said forming the trench capacitor in the third portion of the relaxed region comprises:
etching a trench into a portion of the relaxed region that is separate from the portions underlying the first and second semiconductor devices;
laterally etching one of the first semiconductor material and the second semiconductor material selectively to the other of the first semiconductor material and the second semiconductor material;
forming a first electrode on sidewalls of the first semiconductor material and the second semiconductor material that provide the trench;
depositing a node dielectric layer conformally on the sidewalls of the trench; and
filling at least a portion of the trench with a second electrode.

9. The method of claim 8, wherein etching the trench comprises an anisotropic etch.

10. The method of claim 8, wherein the lateral etch comprises $H_2O_2$ wet chemical etching.

11. The method of claim 8, wherein the first electrode is formed using gas phase doping.

12. The method of claim 8, wherein the node dielectric is a high-k dielectric material.

13. The method of claim 12, wherein the high-k dielectric material is deposited using atomic layer deposition.

14. The method of claim 8, wherein the second electrode is a metal deposited using atomic layer deposition.

15. A method of forming an electronic device comprising:
providing a substrate structure including a strain relaxed buffer region in a relaxed region;
forming a first strained semiconductor on a first side of the relaxed region;
forming a second strained semiconductor on a second side of the relaxed region; and
forming a trench capacitor in a third portion of the relaxed region within the strain relaxed buffer region, wherein a width of the trench capacitor alternates between at least two width dimensions, a node dielectric of the capacitor being a conformal layer on an entirety of a sidewall of a trench containing said trench capacitor, wherein the node dielectric extends vertically along a sidewall of an interlevel dielectric to provide that an upper surface of the node dielectric is coplanar with an upper surface of gate structures for semiconductor devices present on the first strained semiconductor and the second strained semiconductor.

16. The method of claim 15, wherein the relaxed region is formed on a silicon (Si) substrate.

17. The method of claim 16, wherein the relaxed region comprises a first semiconductor material of silicon and a second semiconductor material of silicon germanium comprising 25% germanium or less.

18. The method of claim 17, wherein the first and second semiconductor material layer have a thickness of 45 nm or less.

19. The method of claim 18, wherein said forming the trench capacitor comprises:
etching a trench into a portion of the relaxed region;
laterally etching one of the first semiconductor material and the second semiconductor material selectively to the other of the first semiconductor material and the second semiconductor material;
forming a first electrode on sidewalls of the first semiconductor material and the second semiconductor material that provide the trench;
depositing a node dielectric layer conformally on the sidewalls of the trench; and
filling at least a portion of the trench with a second electrode.

20. The method of claim 19, wherein etching the trench comprises an anisotropic etch.

* * * * *